United States Patent [19]

Maserjian

[11] Patent Number: 4,903,101
[45] Date of Patent: Feb. 20, 1990

[54] TUNABLE QUANTUM WELL INFRARED DETECTOR

[75] Inventor: Joseph Maserjian, Goleta, Calif.

[73] Assignee: California Institute of Technology, Pasadena, Calif.

[21] Appl. No.: 174,111

[22] Filed: Mar. 28, 1988

[51] Int. Cl.$^4$ .............................................. H01L 27/14
[52] U.S. Cl. ........................................ 357/30; 357/4; 357/16; 357/58; 357/32; 250/370.14
[58] Field of Search ............... 357/32, 30 B, 30 E, 357/30 H, 30 R, 4, 16, 58; 250/370.14

[56] References Cited

U.S. PATENT DOCUMENTS

| | | | |
|---|---|---|---|
| 4,250,515 | 2/1981 | Esaki et al. | 357/81 X |
| 4,525,731 | 6/1985 | Chappell et al. | 357/58 X |
| 4,581,621 | 4/1986 | Reed | 357/16 X |
| 4,620,206 | 10/1986 | Ohta et al. | 357/4 |
| 4,620,214 | 10/1986 | Margalit et al. | 357/63 |
| 4,816,878 | 3/1989 | Kano et al. | 357/16 X |

FOREIGN PATENT DOCUMENTS

| | | | |
|---|---|---|---|
| 0149178 | 7/1985 | European Pat. Off. | 357/4 |
| 0186336 | 7/1986 | European Pat. Off. | 357/4 |
| 0206117 | 12/1986 | European Pat. Off. | 357/30 E |
| 2607940 | 9/1977 | Fed. Rep. of Germany | 357/4 |
| 60-7121 | 1/1985 | Japan | 357/4 |

OTHER PUBLICATIONS

Chang et al, "The Growth of a GaAs-GaAlAs Superlattice," *J. Vac. Sci. Technol.*, vol. 10, No. 1, Jan./Feb. 1973, pp. 11-16.
Levine et al, "High Field Hot Electron Transport through $Al_xGa_{1-x}As$ Multiquantum Well Superlattices," *Solid-State Electronics*, vol. 31, No. 34, 1988, pp. 583-587.
Nakagawa et al, "Observation of Resonant Tunneling in AlGaAs/GaAs Triple Barrier Diodes," Appl. Phys. Lett., 49(2), 14 Jul. 1986, pp. 73-75.
Summers et al, "Variably Spaced Superlattice Energy Filter, a New Device Design Concept for High-Energy Electron Injection," Appl. Phys. Lett., 48(12), 24 Mar. 86, pp. 806-808.
Tan et al, "Effect of Impurity Trapping on the Capacitance-Voltage Characteristics of n-GaAs/N-AlGaAs Heterojunctions," *Appl. Phys. Lett.*, vol. 48, No. 6, 10 Feb. 86, pp. 428-430.

Primary Examiner—William Mintel
Attorney, Agent, or Firm—Ashen Golant Martin & Seldon

[57] ABSTRACT

A novel infrared detector (20, 20', 20''), is provided, which is characterized by photon-assisted resonant tunneling between adjacent quantum wells (22a, 22b) separated by barrier layers (28) in an intrinsic semiconductor layer (24) formed on an n+ substrate (26), wherein the resonance is electrically tunable over a wide band of wavelengths in the near to long infrared region. An n+ contacting layer (34) is formed over the intrinsic layer and the substrate is n+ doped to provide contact to the quantum wells. The detector permits fabrication of arrays (30) (one-dimensional and two-dimensional) for use in imaging and spectroscopy applications.

18 Claims, 3 Drawing Sheets

TUNABLE QUANTUM WELL INFRARED DETECTOR

The invention described herein was made in the performance of work under a NASA contract, and is subject to the provisions of Public Law 96-517 (35 U.S.C. 202) in which the Contractor has elected to retain title.

TECHNICAL FIELD

The present invention relates to infrared detectors, and, more particularly, to tunable infrared detectors useful in imaging arrays.

BACKGROUND ART

There exists a major need for infrared imaging arrays in a variety of applications. For example, NASA Earth and space science applications need detector arrays for infrared imaging spectrometers.

Considerable effort has been expended to develop II-VI semiconductors, e.g., (Hg,Cd)Te, to achieve intrinsic semiconductor detectors capable of operating in the near and long wavelength infrared region of 3 to 30 micrometers. The fabrication of detectors in this range from III-V materials would be highly advantageous, because these materials are more highly developed and have properties that are superior to II-VI compounds.

Recently, quantum well detectors have been demonstrated in III-V materials. These detectors evidence good detectivity in the wavelength region near 10 micrometers. These are based on the process of infrared absorption between the ground and first excited states of the quantum wells. This approach is limited to a narrow range of wavelengths for a given detector, and is difficult to fabricate into large arrays because of the large number of multiple quantum wells (at least about fifty) required to obtain good optical absorption. They also exhibit complicated current-voltage characteristics because of the presence of high field domains required to maintain current continuity through the multiple quantum well structures.

Despite such advances, the need still exists for infrared detectors which provide good sensitivity, tunable over a wide range of wavelengths, and which can be fabricated into imaging arrays with good yields and high reliability.

DISCLOSURE OF INVENTION

In accordance with the invention, a novel infrared detector is provided, which is characterized by photon-assisted resonant tunneling between adjacent quantum wells formed in a semiconductor structure, wherein the resonance is electrically tunable over a wide band of wavelengths, for example, about 3 to 100 μm.

The tunable quantum well detector of the invention comprises a quantum well structure formed on an n+-doped substrate comprising a III-V semiconductor material. The quantum well structure comprises at least one quantum well sandwiched by two barrier layers and formed in an intrinsic layer comprising a III-V semiconducting material. An n+ contacting layer is formed on the intrinsic layer. The quantum wells comprise a material having a first bandgap and the barrier layers comprise a material having a second bandgap, with the second bandgap greater than the first bandgap.

The detector can be readily configured into line arrays and stacked into two-dimensional arrays. It is also compatible with on-clip electronic signal conditioning and pre-processing.

As a consequence of the teachings of the invention, infrared imaging arrays in the near-to-long wavelength region may be constructed, where no satisfactory approach based on intrinsic detectors for higher temperature operation currently exists. Such arrays also permit simple and compact imaging spectrometers, eliminating the need for bulky diffraction gratings and mechanical scanning instrumentation.

BEST MODES FOR CARRYING OUT THE INVENTION

Figure 1:
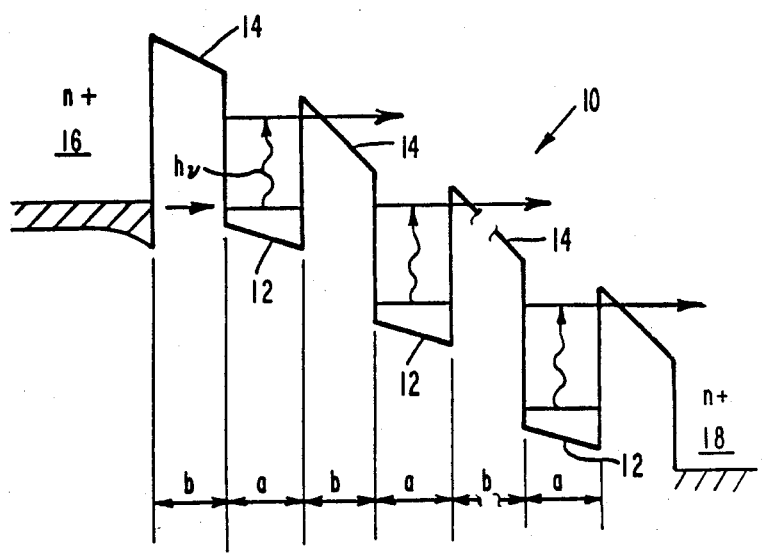
FIG. 1, on coordinate of energy and distance, is an energy diagram of III-V quantum well detectors of the prior art.

FIG. 1 depicts a typical prior art quantum well device 10, such as described under Background Art, comprising a plurality of quantum wells 12 sandwiched by a plurality of barriers 14. In the prior art device 10, there are typically fifty such wells 12, separated by barriers 14, formed on an n+ substrate 16, which provides one contact. An n+ layer 18 is used to provide another contacting layer. Such a device operates by inter-sub band absorption followed by tunneling, as illustrated in FIG. 1.

In contrast, the tunable quantum well detector 20 of the invention is based on photon-assisted resonant tunneling between wells, thereby achieving tunability over a wide spectral range by changing the applied electrical field.

Figure 2:
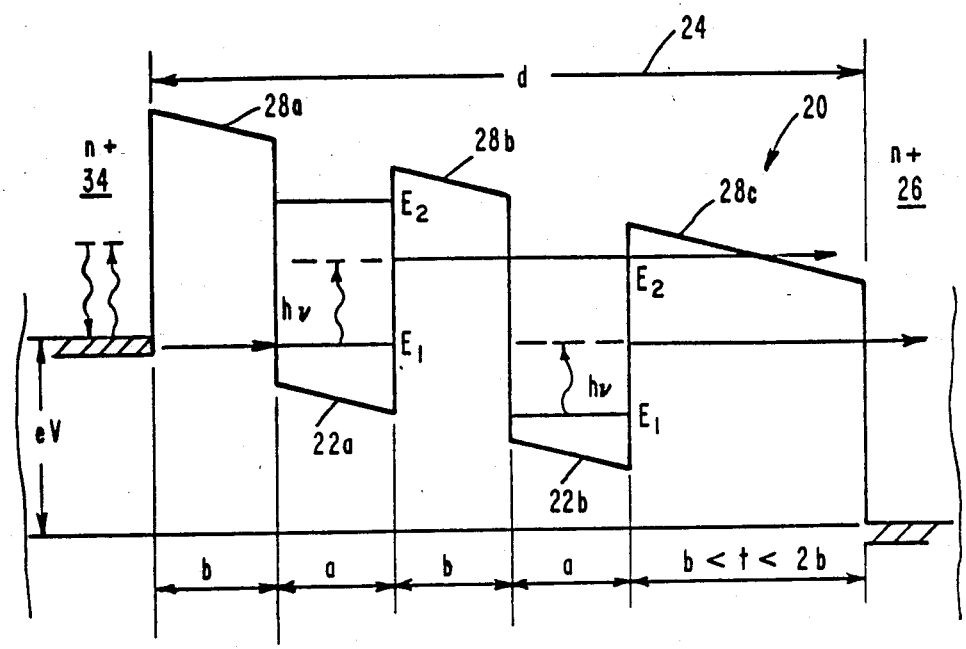
FIG. 2, on coordinates of energy and distance, is an energy diagram of one embodiment of the tunable quantum well detector of the invention.

Photon-assisted resonant tunneling into the excited state of the adjacent well, as shown by the energy diagram of FIG. 2, can be expected to exhibit much weaker optical absorption than prior art devices 10. In fact, absorption should be reduced by the tunnel probability to the excited state in the adjacent well, as given by:

$$P = \exp(-2\kappa b), \quad (1)$$

where $\kappa$ is the average attenuation coefficient in the barrier and $b$ is width of the barrier. The value of $\kappa$ can be directly evaluated from the effective mass, energy, and field.

Significantly, by choosing the quantum wells appropriately, the absorption coefficient can be made compatible with absorption over much longer distance appropriate in an optical waveguide structure. For example, if P is set to the order of $10^{-3}$, the absorption distance in a waveguide would be on the order of a few millimeters—a convenient distance. Only the electric field component of the incident light normal to the quantum well is responsible for absorption. Therefore, the detector is also sensitive to polarization of the light signal; a property which can also be used to advantage in some applications.

A particularly attractive feature of this approach is the large range of photon energies $h\nu$, which can be tuned by merely changing the applied voltage V; namely, $\delta E < h\nu < \Delta E$. $\Delta E$ is the energy difference between the final and initial states with no applied voltage V. The condition for resonance is approximately:

$$h\nu = \Delta E - eV(a+b)/d. \quad (2)$$

The smallest value of $h\nu$ that can be resolved must correspond to the width $\delta E$ of the quantum energy states, such as $E_1$ and $E_2$, shown in FIG. 2. This depends theoretically on the barrier width and field, and practically on inhomogeneous broadening of realizable quantum wells. Values of $\delta E$ as low as 5 meV have been realized in single wells.

In accordance with one embodiment of the invention, illustrated in FIG. 2, a device 20 comprises a double quantum well structure 22, with quantum wells 22a, 22b, formed in an intrinsic layer 24 of thickness d on an n+ bottom contact layer 26. The bottom contact layer 26 is formed over a substrate 27 which is either lightly doped n-type (n−) or semi-insulating, to minimize free carrier absorption. The quantum wells 22a, 22b, each having a width a, are separated by a barrier 28a having a width b. Additional barriers 28b, 28c are provided on either side of the quantum well structure 22. The double well structure of the invention should give sharp resonance if inhomogeneous broadening is not too significant. The use of this barrier configuration (as compared with those of FIGS. 3 and 4) allows for wider wells and therefore smaller values of broadening $\delta E$.

The quantum wells consist of alternating layers of two dissimilar III-V semiconductor materials, one called the quantum well layer 22 and the other called the barrier layer 28. The material comprising the quantum well layer 22 is approximately lattice-matched and has a lower band-gap than the material comprising the barrier layer 28. The conduction band offset between the two materials must be such as to create quantum wells 22. Here, $\Delta E = E_2 - E_1$ when $V=0$.

The width a of the two quantum wells 22a, 22b is chosen so that only two states, $E_1$ and $E_2$, exist, with $E_2$ close to the top of the well. This latter condition assures that the photo-excited electron can escape most of the time without relaxing into the ground state, where it becomes temporarily trapped. The width b of the barriers is chosen to provide sufficient well confinement without excessive broadening of the energy levels ($\delta E$) and to optimize the absorption coefficient along the waveguide. As indicated in FIG. 2, the third barrier 28c is made thicker than b to block photo-assisted tunneling from the ground state of the normally-empty second well 22b into the continuum of states beyond the third barrier, but not too thick to prevent removal of electrons by gradual tunneling out. The thickness t of the third barrier 28c may be expressed as $b < t < 2b$.

Using, for example, GaAs for the quantum wells 22 and $Al_xGa_{1-x}As$, where $x=0.45$, for the barriers 28, the thickness a of the quantum wells is typically about 50 to 100 Å, while the thickness b of the barrier layers is typically about 50 to 100 Å.

Figure 3:
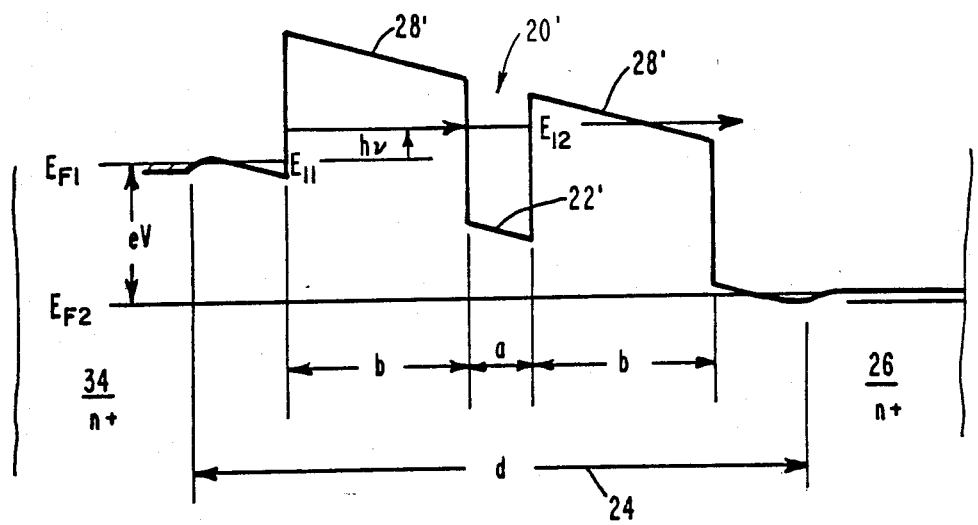
FIG. 3, on coordinates of energy and distance, is an energy diagram of another embodiment of the tunable quantum well detector of the invention.

FIG. 3 depicts an alternate embodiment in which one quantum well 22′ is sandwiched by two barrier layers 28′. This structure 20′ provides for only a single higher level $E_{12}$. Here, $\Delta E = E_{12} - E_{11}$ when $V=0$. This structure 20′ evidence broader $\delta E$, but there is no problem with scattering from $E_{12}$ into $E_{11}$ as there is from $E_2$ into $E_1$ in the structure 20 of FIG. 2. This structure 20′ also has the advantage of being simpler than the double barrier structure 20″ depicted in FIG. 4.

Using the same (Al,Ga)As/GaAs materials system as an example, the quantum well of thickness a 22′ ranges from about 10 to 20 Å, while each barrier layer 28′ of thickness b ranges from about 50 to 100 Å. The overall thickness of the intrinsic layer d is about 200 Å.

Figure 4:
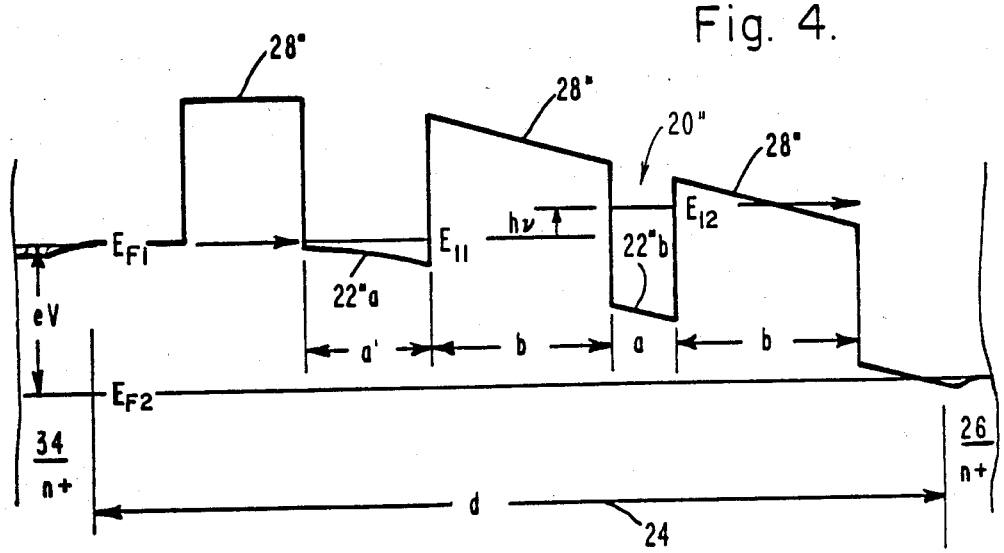
FIG. 4, on coordinates of energy and distance, is an energy diagram of yet another embodiment of the tunable quantum well detector of the invention.

FIG. 4 depicts yet another embodiment of the invention. Here, two quantum wells 22″ are sandwiched by three barrier layers 28″. The first quantum well 22″a, called the source well, provide a more monoenergetic source of electrons, giving rise to a sharper resonance and therefore a better ratio of photo-to-dark current. As in FIG. 3, $\neq E = E_{12} - E_{11}$ when $V=0$.

Using the same (Al,Ga)As/GaAs materials system as above, the first quantum well 22″a of thickness a′ is equal to about 50 to 100 Å, while the second quantum well 22″b of thickness a is equal to about 10 to 20 Å. The three barriers 28″, each of thickness b, range from about 50 to 100 Å.

The quantum wells 22, 22′, 22″ and barrier layers 28, 28′, 28″ can be grown by a variety of processes, such as molecular-beam-epitaxy (MBE), from a number of possible III-V semiconductor materials. Alternating layers of the two III-V materials are formed by MBE to construct the barrier/quantum well layers. A notable example of a barrier/quantum well materials system is $Al_xGa_{1-x}As/GaAs$. However, this material system provides a relatively small conduction band offset (about 0.32 eV for $x=0.45$) which limits the maximum photon energy, $\Delta E$. Other candidate materials systems include GaAs/(In,Ga)As, (In,Al)As/(In,Ga)As, (Ga,Al)As/(In,Ga)As, and AlSb/InAs, which give larger conduction band offsets, and thus a larger photon energy range. AlSb/InAs is particularly promising, having about one electron-volt offset.

Figure 5:
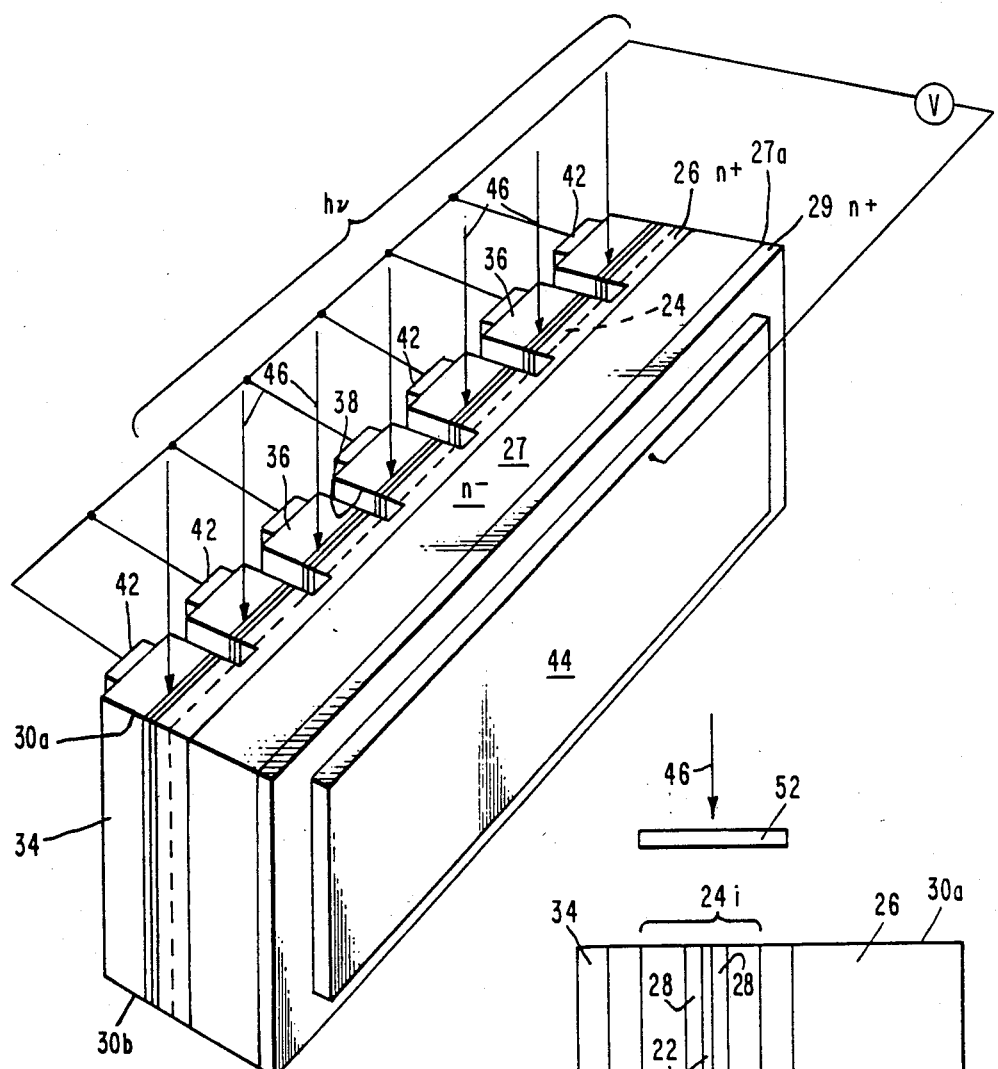
FIG. 5 is a perspective view of an example of a line array detector made in accordance with the invention.

FIG. 5 illustrates the construction of a line array detector 30 made according to the present invention. The quantum wells 22, barrier layers 28, and semiconductor doping are formed by MBE growth over an n+ bottom contact layer 26 in turn formed on a lightly doped n-type or semi-insulating substrate wafer 27, such as GaAs. In particular, the quantum wells 22 and barriers 28 are formed in an undoped (ideally, intrinsic) layer 24, over which is formed an n+ top contact layer 34, typically about 1 μm thick. Both the bottom contact 26 and the top contact layer 34 are degenerately doped, to at least $10^{18}$ cm$^{-3}$. The n+ doping provides internal contact to the quantum well layers 22.

The line detector 30 can be etched and cleaved into this configuration, using techniques well-established in the art. The structure may be separated into pixel elements 36 by grooves 38. For improved absorption over the spectral range of interest, an anti-reflection coating (not shown) may be formed on the cleaved edge 30a. Any of the common anti-reflective materials, such as silicon nitride, which are compatible with the materials system selected may be employed.

Electrical connections are made through metal contacts 42, 44, such as 500 nm of aluminum, deposited on the n+ layer 34 and on an n+ layer 29 formed over the back surface 27a of the n− wafer 27, respectively.

Alternate well-known metallization schemes (such as germanium-gold-nickel alloying) may be required if the n+ doping is insufficient to achieve good contact. In the choice of semi-insulating substrates, contact must be made at the periphery of the array on the front surface, by use of etching and lithographic techniques that are well-known.

In use, incident light $h\nu$ is focused onto the cleaved edge 30a of the structure, as shown by the arrows 46 in FIG. 5. In the simpler structure, the light travels along the optical waveguide formed by the surface and barrier layers of the quantum well 22, due to its different refractive index—as is well-known. The optical waveguide may be optimized for better confinement by the use of additional layers of material with a different refractive index.

Figure 6:
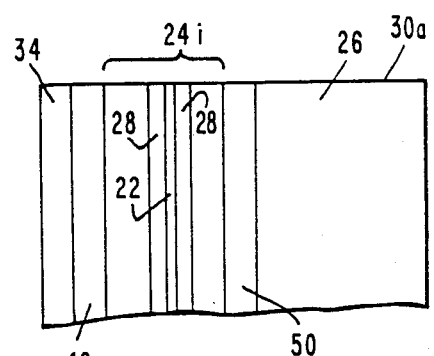
FIG. 6 is an enlarged view in cross-section of a portion of FIG. 5.

In order to have a better defined waveguide structure, it may be advantageous to provide additional layers 48, 50 of $Al_xGa_{1-x}As$, as shown in FIG. 6, which serve to confine light in the region therebetween. These layers must also be heavily doped n+ and at least about 0.5 $\mu$m thick.

The quantum wells 22 and barriers 28 are located entirely within the undoped i-region 24 (ideally intrinsic). Therefore, an external voltage applied across the chip, to the contacts on the n+ layer 34 and the back side 26a of the chip 26, provides the field required to change the resonant photon energy. The i-region 24 extends at least over the barriers 28 and the quantum well regions 22 and preferably an additional amount on either side, to account for variations in processing, etc.

In operation, with the application of an external voltage, there will be an external current flowing between the two contacts 26 and 34. With no light incident, there will be a dark current, which should be minimized. With incident light 46, there will be an additional component of current, which is the photon-assisted tunneling current. According to the teachings of the invention, the ratio of the photo current to the dark current should be optimized, as discussed above. This current is detected by external circuitry (not shown) and is proportional to the intensity of the incident light 46.

External circuitry could be fabricated monolithically on the same wafer, located at the far end 30b of the line array (bottom of FIG. 5). These line array structures may be stacked to achieve two-dimensional arrays, at the expense of a more complex package structure.

To suppress light falling above the normal resonant band ($\Delta E$), an optical (low pass) filter 52, such as InAs, may be inserted between the light 46 and the cleaved edge 30a, so that the short wavelength corresponding to energies greater than $\Delta E$ do not cause transitions leading to an undesired photocurrent.

As a tunable detector functioning as a spectrometer, the applied voltage may be varied according to Eqn. (2). The resulting photocurrent in the presence of incident light 46 is recorded to provide a measure of intensity as a function of wavelength.

INDUSTRIAL APPLICABILITY

The tunable quantum well infrared detector of the invention is expected to find use in a variety of imaging arrays which are tunable over a wide range of wavelengths, for example, about 3 to 100 $\mu$m.

Thus, there has been disclosed a tunable quantum well infrared detector capable of tuning over the near and long wavelength infrared region of 3 to 100 micrometers. Various changes and modifications of an obvious nature may be made by one skilled in the art without departing from the spirit and scope of the invention, and all such changes and modifications are considered to fall within the scope of the invention, as defined by the appended claims.

What is claimed is:

1. A tunable quantum well detector for detecting infrared radiation comprising (a) a quantum well structure formed in an intrinsic layer comprising a III-V semiconducting material formed over an n+ bottom contact layer comprising a III-V semiconductor material, (b) an n+ top contact layer formed on said intrinsic layer, said quantum well structure comprising at least one and less than three quantum wells confined by barrier layers connecting said at least one quantum well to said contact layers, said barrier layers thin enough to permit photon-assisted tunneling of charge carriers from a first electronic state in one well to a second, excited electronic state in an adjacent well, and (c) means for applying an electric field to both said contact layers for adjusting the respective energy levels of said first and second electronic states to achieve said tunability.

2. The detector of claim 1 comprising a double quantum well structure comprising two quantum wells confined by three barrier layers.

3. The detector of claim 2 wherein each said quantum well has a width a so that only two states, $E_1$ and $E_2$, exist, with $E_2$ below the top of said well and with photon transitions occurring between $E_1$, corresponding to a state residing primarily in one of the group consisting of one quantum well and said top contact layer, and $E_2$, corresponding to a state residing primarily in the other quantum well.

4. The detector of claim 1 wherein one quantum well is provided with a width a so that only one state $E_{12}$ is associated with this well and lies below the top of said well confined by two barrier layers and wherein photon transitions occur between a ground state $E_{11}$ associated with said contact layer and the state $E_{12}$ associated with said quantum well.

5. The detector of claim 1 wherein two quantum wells are confined by three barrier layers, with one well adjacent said bottom contact layer and having at least about five times the width as the other quantum well and wherein photon transitions occur between a ground state $E_{11}$ associated with said one well and an excited state $E_{12}$ in said other well.

6. The detector of claim 1 wherein said barrier layers/quantum wells comprise a mterials system selected from the group consisting of (Al,Ga)As/GaAs, GaAs/(In,Ga)As, (In,Al)As/(In,Ga)As, (Ga,Al)As/(In,Ga)As, and AlSb/InAs.

7. The detector of claim 1 wherein said barrier layers have a width b chosen to optimize the absorption coefficient along the waveguide, while providing sufficient quantum confinement.

8. An array of tunable quantum well detectors for detecting infrared radiation, each detector comprising (a) a quantum well structure formed in an intrinsic layer comprising a III-V semiconducting material formed over an n+ bottom contact layer comprising a III-V semiconductor material, (b) an n+ top contact layer formed on said intrinsic layer, said quantum well structure comprising at least one and less than three quantum wells confined by barrier layers connecting said at least one quantum well to said contact layers, said barrier layers thin enough to permit photon-assisted tunneling of charge carriers from a first electronic state in one well to a second, excited electronic state in an adjacent well, and (c) means for applying an electric field to both said contact layers for adjusting the respective energy levels of said first and second electronic states to achieve said tunability.

9. The array of claim 8 wherein each said detector comprises a double quantum well structure comprising two quantum wells and three barrier layers.

10. The array of claim 9 wherein each said quantum well has a width a so that only two states, $E_1$ and $E_2$, exist, with $E_2$ below the top of said well and with photon transitions occurring between $E_1$, corresponds to a state residing primarily in one of the group consisting of one quantum well and said top contact layer, and $E_2$, corresponding to a state residing primarily in the other quantum well.

11. The array of claim 8 wherein each detector comprises one quantum well provided with a width a so that only one state $E_{12}$ in associated with this well and lies below the top of said well confined by two barrier layers and wherein photon transitions occur between a ground state $E_{11}$ associated with said contact layer and the state $E_{12}$ associated with said quantum well.

12. The array of claim 8 wherein each said detector comprises two quantum wells confined by three barrier layers, with one well adjacent said bottom contact layer and having at least about five times the width as the other quantum well and wherein photon transitions occur between a ground state $E_{11}$ associated with said one well and an excited state $E_{12}$ in said other well.

13. The array of claim 8 wherein said barrier layers/quantum wells comprise a materials system selected from the group consisting of (Al,Ga)As/GaAs, GaAs/(In,Ga)As, (In,Al)As/(In,Ga)As, (Ga,Al)As/(In,Ga)As, and AlSb/InAs.

14. The array of claim 8 wherein said barrier layers have a width b chosen to optimize the absorption coefficient along the waveguide, while providing sufficient quantum confinement.

15. The array of claim 8 further provided with waveguiding layers for guiding infrared radiation being detected and coupling that portion of the electric field vector of said infrared radiation which is perpendicular to said quantum well into said quantum well for exciting electrons therein, said waveguiding layers disposed on both sides of said intrinsic layer.

16. The array of claim 8 wherein an optical filter is placed between light incident on said quantum well structure and said quantum well structure to suppress light falling above the normal resonant band.

17. The detector of claim 2 further provided with a first barrier layer connecting one quantum well to said top contact layer, a second barrier layer connecting the other quantum well to said bottom contact layer, and a third barrier layer between said quantum wells, with the width of said first and third barrier being substantially the same and with the width of said second barrier being large enough to block photo-assisted tunneling but not so large as to prevent removal of electrons by gradual tunneling out.

18. The array of claim 9 wherein each said detector is further provided with a first barrier layer connecting one quantum well to said top contact layer, a second barrier layer connecting the other quantum well to said bottom contact layer, and a third barrier layer between said quantum wells, with the width of said first and third barrier being substantially the same and with the width of said second barrier being large enough to block photo-assisted tunneling but not so large as to prevent removal of electrons by gradual tunneling out.

* * * * *